US00RE40951E

(19) United States
(12) Reissued Patent
Kodaira et al.

(10) Patent Number: US RE40,951 E
(45) Date of Reissued Patent: Nov. 10, 2009

(54) DRY ETCHING METHOD FOR MAGNETIC MATERIAL

(75) Inventors: Yoshimitsu Kodaira, Kawasaki (JP); Taichi Hiromi, Kawasaki (JP)

(73) Assignee: Canon Anelva Corporation, Kanagawa (JP)

(21) Appl. No.: 12/138,280

(22) Filed: Jun. 12, 2008

Related U.S. Patent Documents

Reissue of:
(64) Patent No.: 7,060,194
Issued: Jun. 13, 2006
Appl. No.: 10/897,127
Filed: Jul. 23, 2004

(30) Foreign Application Priority Data

Jul. 24, 2003 (JP) ..... 2003-201254

(51) Int. Cl.
*C23F 1/44* (2006.01)

(52) U.S. Cl. ..... 216/22; 216/57; 216/67; 216/72; 216/75; 29/603.18

(58) Field of Classification Search ..... 216/22
See application file for complete search history.

(56) References Cited

U.S. PATENT DOCUMENTS

| | | | | |
|---|---|---|---|---|
| 4,687,543 | A | 8/1987 | Bowker | 156/643 |
| 5,171,411 | A | 12/1992 | Hillendahl et al. | 204/192.12 |
| 5,409,738 | A | 4/1995 | Matsunuma et al. | 427/802 |
| 5,425,844 | A * | 6/1995 | Hirata | 216/22 |
| 6,238,582 | B1 * | 5/2001 | Williams et al. | 216/22 |
| 6,794,297 | B2 | 9/2004 | Noda | 438/706 |
| 6,821,907 | B2 * | 11/2004 | Hwang et al. | 438/709 |
| 6,825,156 | B2 | 11/2004 | Lee et al. | 570/176 |
| 2002/0096493 | A1 * | 7/2002 | Hattori | 216/51 |
| 2003/0038106 | A1 * | 2/2003 | Covington et al. | 216/2 |
| 2003/0052079 | A1 | 3/2003 | Yoshioka et al. | 216/22 |
| 2003/0170998 | A1 | 9/2003 | Mise et al. | 438/710 |
| 2004/0222185 | A1 * | 11/2004 | Kawai | 216/22 |

FOREIGN PATENT DOCUMENTS

JP 08-253881 10/1996

OTHER PUBLICATIONS

Formation of TMR element by etching using CH3OH, Feb. 10, 2004, http://anelva.co.jp/english/news/products/mram.html.*

Hawley's "Condensed Chemical Dictionary", 14th Ed. Published by John Wiley & Sons, Inc. 2001, p. 29.

* cited by examiner

*Primary Examiner*—Allan Olsen
(74) *Attorney, Agent, or Firm*—Fitzpatrick, Cella, Harper & Scinto

(57) ABSTRACT

A dry etching method in which a plasma of an etching gas is generated and a magnetic material is dry-etched using a mask material made of a non-organic material, wherein an alcohol having at least one hydroxyl group is used as the etching gas. The alcohol used as the etching gas has one hydroxyl group such as an alcohol selected from the group including methanol ($CH_3OH$), ethanol ($C_2H_5OH$) and propanol ($C_3H_7OH$).

21 Claims, 3 Drawing Sheets

DRY ETCHING METHOD FOR MAGNETIC MATERIAL

Matter enclosed in heavy brackets [ ] appears in the original patent but forms no part of this reissue specification; matter printed in italics indicates the additions made by reissue.

CROSS-REFERENCE TO RELATED APPLICATIONS

The present application claims priority of JP 2003-201254, filed in Japan on Jul. 24, 2003, the entire contents of which is incorporated hereby reference. *This application is a reissue of U.S. Pat. No. 7,060,194 B2, which issued from application Ser. No. 10/897,127 filed Jul. 23, 2004.*

BACKGROUND OF THE INVENTION

1. Field of the Invention

The present invention relates to a embodiments. More particularly, the present invention relates to a embodiments useful for micro fabricating of a thin magnetic film such as the thin film of FeNi, CoFe, FeMn, CoPt or the like.

2. Description of the Background Art

MRAM (Magnetic Random Access Memory) is an integrated magnetic memory, and in these days, MRAM has attracted attention as a memory, which is rewritable without limit, and having a packing density of components as high as DRAM and a speed performance as high as SRAM. On the other hand, a thin film magnetic head, a magnetic sensor and the like constituting a magnetoresistive device such as GMR (giant magnetoresistance) and TMR (tunneling magnetoresistance) have been developed with rapid progress.

In an etching process for a magnetic material, ion milling has been well adopted. But, when using ion milling in an etching process for a magnetic material, there has been problems. For example, one problem is a difficulty of selectivity relative to masks made of various kinds of material.

With respect to a processed shape, when using ion milling in an etching process for a magnetic material, a profile of material to be etched has tapered tails. This is also a problem.

The before described problems are caused by the reason that ion milling is a physical spattering etching.

Therefore, the ion milling is not suitable for production of MRAM with a large capacity for which an especially micro fabrication technique is required. And, in these days, if the ion milling is used for producing a large area substrate such as the substrate having 300 mm in diameter, it is difficult to process with good uniformity and with good product yield.

Recently, instead of the ion milling which involves the before described problems, techniques having been fostered in the semiconductor industry is introduced into etching process for a magnetic material.

Among the techniques having been fostered in the semiconductor industry, RIE (Reactive Ion Etching) is expected as a technique which can be used in an etching process for a magnetic material. RIE (Reactive Ion Etching) is excellent in micro fabricating property, and can secure uniformity on a large area substrate such as the substrate having 300 mm in diameter.

However the RIE technique is used widely in the semiconductor industry, if it is used in an etching process for a magnetic material, it is difficult to process magnetic materials such as FeNi, CoFe, CoPt and the like without etching residue and deposition onto a sidewall, since the RIE is generally poor in reactivity on magnetic materials such as FeNi, CoFe, CoPt and the like.

In a case where the RIE technique is employed in etching process of the before described magnetic material, a chlorine gas ($Cl_2$ or the like) has been adopted as an etching gas. If a chlorine gas ($Cl_2$ or the like) is used, however, there is a problem of after-corrosion and a necessity arises for removing remaining chlorine component, attached to a surface layer of a substrate, after the etching. Furthermore, another necessity has arisen for any resistance to corrosion on an RIE apparatus itself against a chlorine gas ($Cl_2$ or the like), which is corrosive gas.

In the current state of the RIE technique to be applied to the before described magnetic materials, an effort has been directed to establish a new reaction system with no need for an aftercorrosion treatment.

Japanese Patent Application Laid-Open (JP-A) No. 8-253881 proposed a gas mixture obtained by adding carbon monoxide (CO) gas to a nitrogen-containing compound such as gases of ammonia ($NH_3$), amines or the like as an etching gas for a magnetic materials. This gas mixture proposed in JP-A-8-253881 is hereinafter referred to as a $NH_3$+CO gas.

Even in the before described $NH_3$+CO gas is used as the etching gas for the before described magnetic material, however, there has been a problem to be solved as described below.

1. It is necessary to provide any facilities for performing an exhaust treatment in an RIE apparatus, since $NH_3$ and CO are toxic.

2. In a construction of TMR, which determines a basic performance of MRAM and a magnetoresistive device, ferromagnetic layers such as CoFe or the like, from which a pinned layer and a free layer sandwiching an insulating layer made of $Al_2O_3$ or the like are made, are ferromagnetic thin films with a small thickness in the range of from 1 to 5 nm. In a case where a $NH_3$+CO gas is used as an etching gas, etching damage is given to the before described extremely thin ferromagnetic layers to degrade magnetic characteristic thereof. So that, it is afraid that an adverse influence would be exerted to device characteristics of MRAM and a magnetoresistive device.

In accordance with miniaturization of MRAM, a magnetoresistive device and the like, a proportion of a side surface (sidewall) of the material (FeNi, CoFe or the like) to be etched relative to all of the device in an RIE treatment has been increased. Therefore, when a $NH_3$+CO gas is used as an etching gas for the magnetic materials, it becomes difficult to neglect the degradation of a magnetic characteristic due to etching damage on a side surface (sidewall) of the material (FeNi, CoFe or the like) to be etched.

OBJECTS AND SUMMARY

It is an object of the present invention to provide a embodiments which can reduce etching damage degrading a magnetic characteristic of the magnetic material, wherein in a case where a magnetic material is etched using a non-organic material as a mask material, an after-corrosion treatment and any resistance to corrosion for an etching apparatus are unnecessary.

In order to achieve the object, in one embodiment of a dry etching method according to the present invention, a plasma of an etching gas is generated and a magnetic material is dry-etched using a mask material made of a non-organic material, wherein an alcohol having at least one hydroxyl group is used as the etching gas.

In the before described embodiment of the present invention, the alcohol used as the etching gas may have one hydroxyl group.

In each of the before described embodiments of the present invention, an alcohol selected from the group consisting of methanol ($CH_3OH$), ethanol ($C_2H_5OH$) and propanol ($C_3H_7OH$) may be used as the etching gas.

In each of the before described embodiments of the present invention, a mask material may be made of a non-organic material. The mask material may comprise a single layer film or a laminated layer film made of anyone selected from the group consisting of Ta, Ti, Al and Si or the mask material may comprise a single layer film or a laminated layer film made of an oxide or a nitride of anyone selected from the group consisting of Ta, Ti, Al and Si.

For example, a single layer film or a laminated layer film made of anyone selected from the group consisting of Ta, Ti, Al and Si, each of which is an elemental metal, can be used as the before described mask material.

Also, a single layer film or a laminated layer film made of Ta oxide, Ti oxide, Al oxides such as $Al_2O_3$ and Si oxides such as $SiO_2$, TaN, TiN, AlN, SiN and the like, which are oxides or nitrides of Ta, Ti, Al and Si respectively can be used as the before described mask material.

In the before described embodiments of the present invention, either of an elemental metal belonging to the iron group in the Group VIII, or a material essentially composed of such an elemental metal can be used as the magnetic materials to be etched.

That is to say, a dry etching method of the present invention can be applied for etching the magnetic materials such as a single layer film or a laminated layer film of Fe—Ni alloy, Co—Fe alloy, Fe—Mn alloy, Co—Pt alloy, Ni—Fe—Cr alloy, Co—Cr alloy, Co—Pt alloy, Co—Cr—Pt alloy, Co—Pd alloy and Co—Fe—B alloy, for example.

In the before described embodiments of the present invention, a temperature of a magnetic material to be etched is preferably maintained at 250° C. or lower. This is because unnecessary thermal damage is not given to a magnetic film, which has an extremely small thickness, and according to this reason, more preferable temperature of a magnetic material to be etched is in the range of from 20 to 100° C.

Also, in the before described embodiments of the present invention, a vacuum degree at which the etching is performed is desirably in the range of from 0.1 to 10 Pa. This is because anisotropy in the dry etching within the before described pressure range can be well reflected in pattern processing due to formation of a high density plasma.

Further, in the before described embodiments of the present invention, an etching gas can be added with oxygen gas, water and an inert gas as an added gas. The gases can be added either alone or in any combination of two or more selected from the group including oxygen gas, water and an inert gas. The oxygen gas and water are desirably added at respective content of not more than 25% relative to the etching gas and the inert gas is desirably added at a content of not more than 90% relative to the etching gas. Examples of the inert gases that can be used include Ar, Ne, Xe, Kr and the like.

Addition of the before described added gas or gases in the before described ranges relative to an etching gas is advantageous in that a selectivity relative to a mask increases. Excess of the upper limit of addition unpreferably decreases an etching rate or a selectivity ratio relative to a mask.

According to the experiments conducted by the present inventors, such a dry etching method is able to improve an etching speed and a selectivity ratio as compared with the before described conventional technique, in which a magnetic material is etched by using the RIE technique with adopting the $NH_3$+CO gas and proposed as a technique which can be processed without conducting an after-corrosion treatment. Especially, in a case of etching on CoFe, the etching speed is increased 50% or more larger than the conventional technique.

The reason why such a dry etching method can exert such an excellent effect is inferred that an H radical, ions such as $H^+$ and $OH^-$ generated in a plasma from alcohol having at least one hydroxyl group used as an etching gas: for example in a case where $CH_3OH$ is used as an etching gas, an active $CH_3$ radical and an active H radical or ions such as $CH_3^+$, $H^+$ and $OH^-$ generated in a plasma react with a magnetic material such as Fe—Ni, Co—Fe, Fe—Mn, Co—Pt, Ni—Fe—Cr, Co—Cr, Co—Pt, Co—Cr—Pt, Co—Pd, Co—Fe—B or the like, and perform the etching.

Also, according to experiments of the present inventors, the etching method can reduce etching damage, which degrading magnetic characteristic, to a level half as high as in the before described conventional method, in which a magnetic material is etched by using the RIE technique with adopting the $NH_3$+CO gas and proposed as a technique which can be processed without conducting an after-corrosion treatment.

According to an embodiment of the present invention, since the dry etching method does not use corrosive $NH_3$ and the like as an etching gas, it is not necessary to apply the after-corrosion treatment after the etching. And it is not necessary to give particular consideration to a resistance against corrosion to be equipped in the etching apparatus. In addition, according to a dry etching method of the present invention, it is not necessary to provide any facilities to be used for exhaust treatment, since none of toxic etching gas such as CO or $NH_3$ is used.

According to another embodiment of the present invention, when a magnetic material is etched with a non-organic material as a mask, it is not necessary to apply the after-corrosion treatment after the etching as well as it is not necessary to give particular consideration to a resistance against corrosion to be equipped in the etching apparatus. In addition, according to an embodiment of the present invention, it is not necessary to provide any facilities to be used for exhaust treatment.

According to an embodiment of the present invention, when a magnetic material is etched with a non-organic material as a mask, it can reduce etching damage which degrading magnetic characteristic.

Therefore, according to the present invention, it is possible to provide a embodiments useful for micro fabricating a magnetic thin film made of a single layer film or a laminated layer film of a Fe—Ni alloy, Co—Fe alloy, Fe—Mn alloy, Co—Pt alloy, Ni—Fe—Cr alloy, Co—Cr alloy, Co—Pt alloy, Co—Cr—Pt alloy, Co—Pd alloy or Co—Fe—B alloy.

BRIEF DESCRIPTION OF THE DRAWINGS

FIGS. 2(a) to 2(d) are views showing one example of a process in a case where a TMR device is etched using an embodiment of the present invention, wherein FIG. 2(a) is a schematic sectional view prior to the start of the process, FIG. 2(b) is a schematic sectional view in a state where a Ta film has been etched with PR as a mask, FIG. 2(c) is a schematic sectional view in a state where a magnetic film has been etched with a Ta mask, and FIG. 2(d) is a schematic sectional view in a state where etching is progressed as far as a free layer and stopped by an $Al_2O_3$ layer.

DESCRIPTION OF THE PREFERRED EMBODIMENTS

Figure 1:
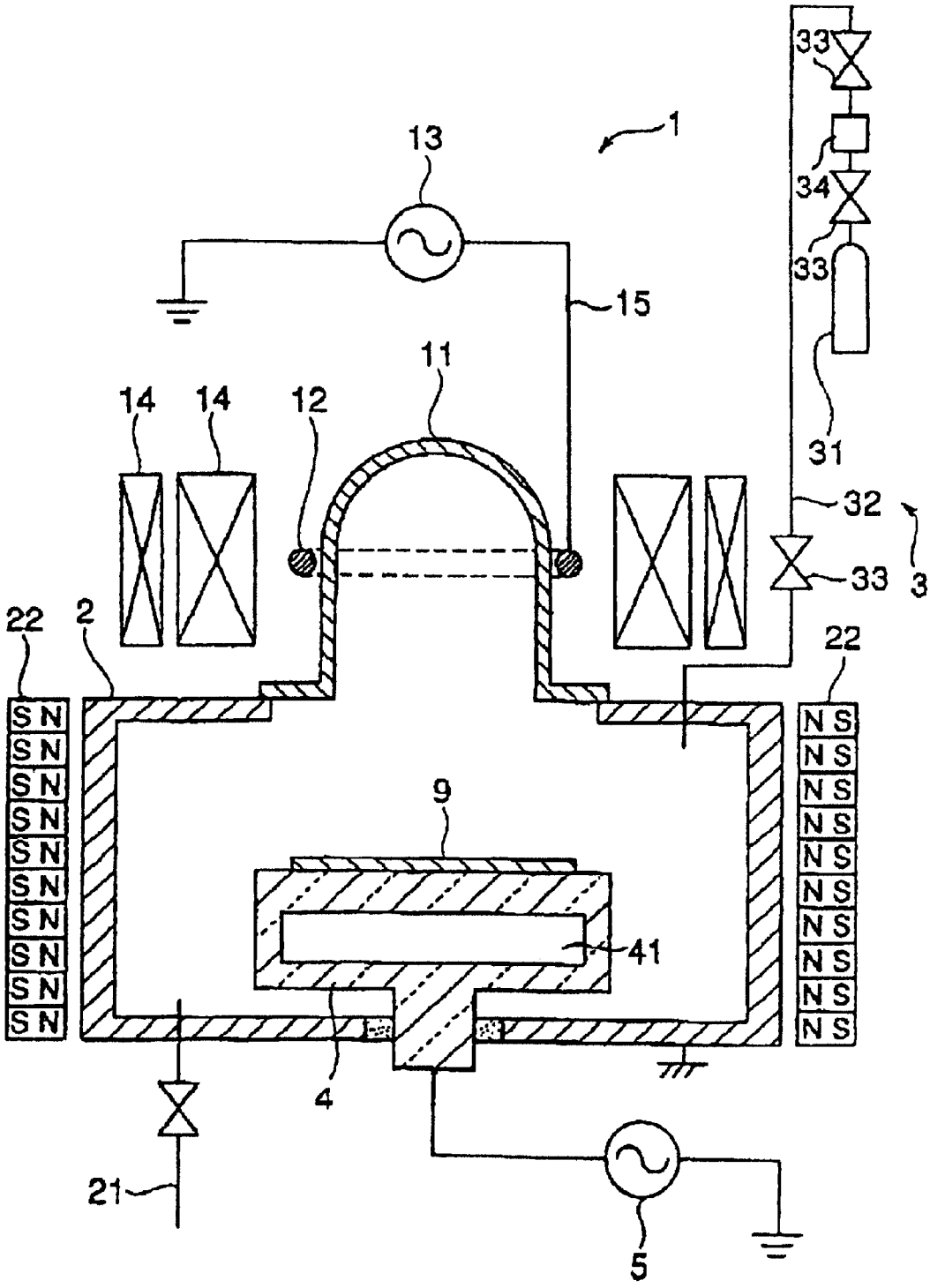
FIG. 1 is a schematic diagram of a construction of an etching apparatus that can be employed in an embodiment of the present invention.
Figure 2A:
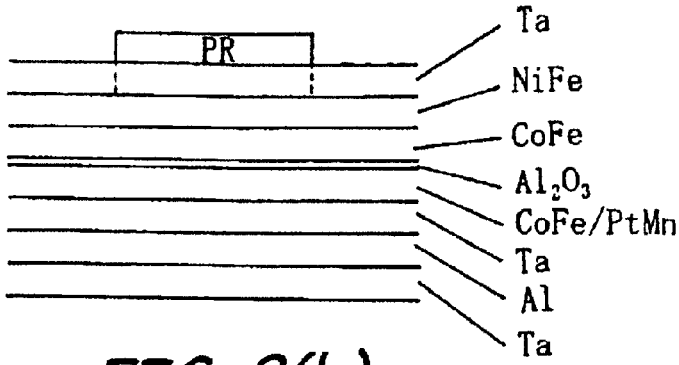

Description will be given of a case where a TMR device shown in FIG. 2(a) is etched using methanol ($CH_3OH$) as an etching gas with Ta as a mask material by using an etching apparatus equipped with an ICP (Inductive Coupled Plasma) plasma source as shown in FIG. 1.

FIG. 2(a) shows an example of basic structure of the TMR device.

A structure characterizing a TMR device is shown in FIG. 2(a) and described as follows.

Said structure includes two ferromagnetic layers made of CoFe called a free layer (a layer above the $Al_2O_3$ layer) and a pinned layer (a layer below the $Al_2O_3$ layer) sandwiching the $Al_2O_3$ film. The $Al_2O_3$ film is an insulating layer with a film thickness of 1 nm. A film thickness of the free layer is 5 nm and a film thickness of the pinned layer is 5 nm. An antiferromagnetic layer made of PtMn is arranged below the pinned layer, and has a film thickness of 15 nm.

A basic principle and workings of the TMR device are known, and they are not subject matter of the present invention, so that the description of them are omitted.

Figure 2B:
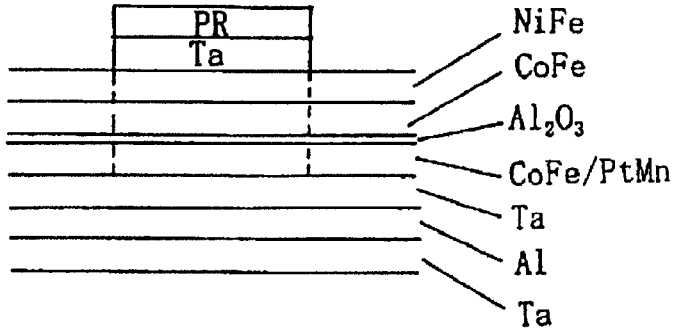

A Ta film was etched on a TMR device with a structure shown in FIG. 2(a) using $CF_4$ gas with PR as a mask, thereby forming Ta film, as shown in FIG. 2(b), to be used as a mask for etching magnetic layers (PtMn and CoFe) including $Al_2O_3$, which is an insulating film. This process is conducted as follows.

A vacuum container 2 shown in FIG. 1 is evacuated by an exhaust system 21. A gate valve not shown is opened, and a wafer 9 on which a TMR film to be fabricated into a TMR device with a structure shown in FIG. 2(a) is laminated is transported into the vacuum container 2, and placed on a substrate holder 4. The wafer 9 and the TMR film laminated thereon are maintained at a predetermined temperature by a temperature control mechanism 41.

A gas introduction system 3 is activated to introduce an etching gas ($CF_4$) at a predetermined flow rate into the vacuum container 2 from a cylinder not shown in FIG. 1 in which $CF_4$ gas is stored through a pipe, a valve and a flow controller, all not shown.

The introduced etching gas diffuses by way of the vacuum container 2 into a dielectric wall container 11. On this occasion, a plasma source 1 is activated.

The plasma source 1 comprises dielectric wall container 11, antenna 12, plasma high frequency power supply 13, and electromagnet 14.

The dielectric wall container 11 is connected airtightly to the vacuum container 2 so as to communicate between the both spaces therein.

The antenna 12 shown in FIG. 1 is a single turn antenna, and generates an induction magnetic field in the dielectric wall container 11.

The plasma high frequency power supply 13 is connected to the antenna 12 through a matching unit not shown and through a transmission line 15, and generates a high frequency power (source power) to be supplied to the antenna 12.

The electromagnet 14 generates a predetermined magnetic field in the dielectric wall container 11.

When a high frequency generated by the plasma high frequency power supply 13 is supplied to the antenna 12 through the transmission line 15, a current flows in the single turn antenna 12, with the result that a plasma is generated in the interior of the dielectric wall container 11.

A large number of sidewall magnets 22 are disposed on the outer sidewall of the vacuum container 2 in a circumferential direction. The magnetic poles, facing the sidewall of the vacuum container 2, of the respective sidewall magnets 22 adjacent to one another are different from one another. Thereby, a cusp magnetic field is formed along the inner surface of the sidewall of the vacuum container 2 in a circumferential direction. The plasma is thus prevented from diffusing toward the inner surface of the sidewall of the vacuum container 2.

In this situation, a bias high frequency power supply 5 is activated to give a self-bias voltage which is a negative DC voltage to the wafer 9, which is an objective in an etching treatment, to thereby control an ion incident energy directed to the surface of the wafer 9 from the plasma.

The plasma generated as described above diffuses from the dielectric wall container 11 into the vacuum container 2 and reaches close to the surface of the wafer 9. In this situation, the surface of the wafer 9 is etched.

The before described etching process using $CF_4$ gas on the Ta film with a PR mask is performed under the following conditions.

Flow rate of the etching gas ($CF_4$): 326 mg/min (50 sccm)

Source power: 500 W

Bias power: 70 W

Pressure in the vacuum container 2: 0.8 Pa Temperature of the substrate holder 4: 40° C.

Then, methanol ($CH_3OH$) is used as an etching gas to etch a magnetic film shown in FIG. 2(b) with Ta formed in the before described process as a mask material.

Figure 2C:
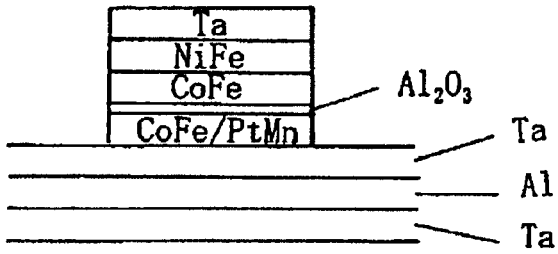

This process is also performed using the etching apparatus equipped with the ICP plasma source shown FIG. 1. The process of introducing $CF_4$ gas as an etching gas into the vacuum container 2 by activating a gas introduction system (not shown) in the before described process is changed to the process of introducing an etching gas ($CH_3OH$) at a predetermined flow rate into the vacuum container 2 from a cylinder 31 in which methanol ($CH_3OH$) gas is stored (shown in FIG. 1) through a pipe 32, a valve 33 and a flow controller 34 by activating gas introduction system 3. The other processes of etching are conducted in similar way to those in the before described process. Thereby, the TMR device shown in FIG. 2(c) is obtained.

Figure 3:
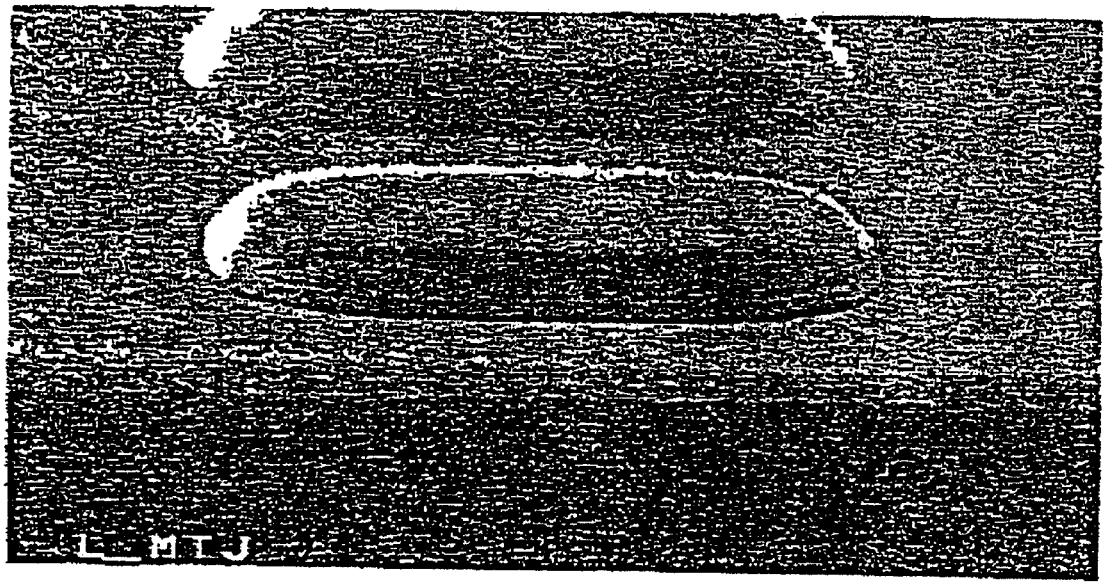
FIG. 3 is an SEM photograph of a shape of MRAM obtained by etching using an embodiment of the present invention.

FIG. 3 is an SEM (Scanning Electron Microscope) photograph of a shape of MRAM obtained by etching in the before described process of the present invention. It is found that etching provides a clean surface without leaving any residue thereon.

COMPARISON TEST EXAMPLE 1

Two cases were compared with each other as to an etching characteristic such as an etching speed and a selectivity ratio.

One case (example of the present invention) where according to the embodiment of the present invention, methanol ($CH_3OH$) is used as the etching gas to etch a magnetic film with Ta formed in a process similar to the process described above as a mask material.

And the other case (comparative example) where the $NH_3$+CO gas is used as the etching gas to etch a magnetic film with the Ta formed in a process similar to the process described above as a mask material.

Magnetic films etched with Ta as a mask material in the both comparison tests are CoFe film and NiFe film.

Both comparison tests are conducted under the following conditions, respectively.

Conditions for the embodiment of the present invention.

Flow rate of the etching gas ($CH_3OH$ gas): 18.75 mg/min (15 sccm)

Source power: 1000 W

Bias power: 800 W

Pressure in the vacuum container 2: 0.4 Pa

Temperature of the substrate holder 4: 40° C.

Conditions for the comparative example.

Flow rate of the etching gas ($NH_3$+CO gas):

$NH_3$ gas: 57.0 mg/min (75 sccm)

CO gas: 31.25 mg/min (25 sccm)

Source power: 1000 W

Bias power: 1200 W

Pressure in the vacuum container 2: 0.8 Pa

Temperature of the substrate holder 4: 40° C.

Results of the before described comparison tests are as shown in the following table.

TABLE 1

| Evaluation items | Methanol ($CH_3OH$) | $NH_3$ + CO gas |
|---|---|---|
| Etching speeds (nm/min) | | |
| CoFe | 34.8 | 21.1 |
| NiFe | 32.1 | 29.3 |
| Selectivity ratios (relative to $Al_2O_3$) | | |
| CoFe | 5.5 | 3.5 |
| NiFe | 5.1 | 4.8 |

The results of the comparison tests show that, according to an embodiment of a dry etching method of the present invention, the etching speed and selectivity ratio are larger than in the case of the conventional embodiments using the $NH_3$+CO gas as the etching gas, especially, the etching speed in the case of CoFe can be increased by 50% or more.

As shown in the table 1, according to the embodiment of the present invention, the selectivity ratio relative to $Al_2O_3$ can be higher.

Figure 2D:
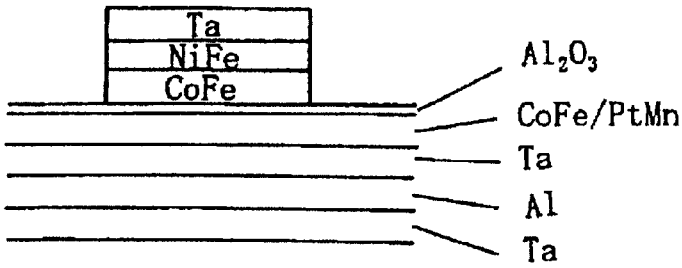

There is a step as one of a fabrication process for MRAM in which as shown in FIG. 2(d), etching is advanced as far as the free layer and stopped at the $Al_2O_3$ layer.

As shown in the table 1, a selectivity ratio relative to $Al_2O_3$ is high according to the method of the present invention.

So that, the method of the present invention is advantageous for fabrication process of MRAM, in which a step where etching is advanced as far as the free layer and then stopped at the $Al_2O_3$ layer is included.

COMPARISON TEST EXAMPLE 2

Comparative study is made between etching damages in magnetic characteristic in a case where an etching treatment is made according to a dry etching embodiment of the present invention and in a case where an etching treatment is made with the $NH_3$+CO gas.

The apparatus shown in FIG. 1 is employed, a magnetic thin film (CoFe and NiFe) is subjected to the etching treatment for an arbitrary time under the before described process conditions of the embodiment of the present invention. The amount of decrease is measured between saturation magnetization before and after the etching treatment, wherein the thickness of magnetic thin films after the etching treatment is converted to the same thickness as before the etching treatment. And then, a ratio in decrease is obtained as the comparative ratio set as 1 for decrease in magnetic thin films (CoFe and NiFe) that is etched by $CH_3OH$ gas.

To be more detailed, magnetic thin films (CoFe and NiFe) with the same physical and chemical characteristics, in which all the films have the same thickness, so saturation magnetization thereof is the same, are prepared and subjected to an etching treatment of the embodiment of the present invention using methanol as an etching gas for an arbitrary time, and to another etching treatment using the $NH_3$+CO gas as an etching gas for an arbitrary time. For both cases, saturation magnetization of specimens after each kind of etching is measured with a vibrating sample magnetometer (VSM).

The etching, followed by the measurement, is repeated on each material (a magnetic thin film: CoFe and NiFe) three or more times during each material (a magnetic thin film: CoFe and NiFe) to be etched is remained, and graphs are prepared that shows relationships between an etching time and saturation magnetization after each etching.

Since an etching amount (in this case, measured with a thickness) is generally proportional to an etching time, plotting of an etching time using the abscissa relative to saturation magnetization to which the coordinate is assigned results in a straight line when being connected on the graph, in which an amount of saturation magnetization decreases monotonously.

This straight line is extrapolated to a point where an etching time=0, thereby obtaining a decrease in saturation magnetization immediately after the etching relative to that prior to the etching.

Results are compared with actual saturation magnetization prior to etching to obtain a decrease in saturation magnetization as an etching damage degrading magnetic characteristic, and furthermore, the results are compared between decreases in saturation magnetization amounts in a case where methanol ($CH_3OH$) is used as an etching gas according to the embodiment of the present invention and in a case where the $NH_3$+CO gas is used as an etching gas.

In the example of the embodiment of the present invention, a CoFe thin film and a NiFe thin film, instead of a TMR device, are individually etched according to the before described embodiment of the present invention using the apparatus shown in FIG. 1 three or more times before the materials (CoFe thin film and NiFe thin film) to be etched is fully etched off to nothing, which is followed by measurement on saturation magnetization, thereby preparing a graph showing a relationship between an etching time and saturation magnetization after each etching.

In a case where the $NH_3$+CO gas is used (comparative example), in the apparatus shown in FIG. 1, the cylinder 31 in which methanol ($CH_3OH$) gas is stored is changed to a cylinder (not shown) in which CO gas is stored and a cylinder (not shown) in which $NH_3$ gas is stored, and a mixed gas of CO gas and $NH_3$ gas is used as an etching gas instead of methanol ($CH_3OH$) to etch materials (CoFe thin film and NiFe thin film) to be etched with the same thickness as the materials (the CoFe thin film and a NiFe thin film) to be etched described above.

That is, the process of introducing an etching gas ($CH_3OH$) at a predetermined flow rate into the vacuum container 2 from a cylinder 31 in which methanol ($CH_3OH$) gas is stored(shown in FIG. 1) through a pipe 32, a valve 33 and a flow controller 34 by activating gas introduction system 3 is changed to the process of introducing an etching gas (a mixed gas of CO gas and $NH_3$ gas) with a predetermined mixing ratio and at a predetermined flow rate into the vacuum container 2 from a cylinder in which CO gas is stored(not shown) and a cylinder in which $NH_3$ gas is stored (not shown) through a pipe 32, valve 33 and a flow controller 34 by activating gas introduction system 3. The other processes of etching are conducted in similar way to those in the before described process of the present invention.

Both processes in Comparison Test Example 2 are conducted under the respective following conditions.

Conditions for the embodiment of the present invention.

Flow rate of the etching gas ($CH_3OH$ gas): 18.75 mg/min (15 sccm),

Source power: 1000 W

Bias power: 200 W

Pressure in the vacuum container 2: 0.4 Pa

Temperature of the substrate holder 4: 40° C.

Conditions for the comparative example.

Flow rate of the etching gas ($NH_3$+CO gas):

$NH_3$ gas: 57.0 mg/min (75 sccm)

CO gas: 31.25 mg/min (25 sccm)

Source power: 1500 W

Bias power: 300 W

Pressure in the vacuum container 2: 0.6 Pa

Temperature of the substrate holder 4: 40° C.

In results of comparison in etching damage obtained from a change in saturation magnetization after etching on the materials (NiFe and CoFe) to be etched, it is found that decrease in saturation magnetization in a case where the $NH_3$+CO gas is used is larger than in a case where $CH_3OH$ gas is used by about 1.6 times for NiFe and about 5.4 times for CoFe regardless of lower etching speed. That is, according to an embodiment of the present invention, it is confirmed that etching damage, which degrading a magnetic characteristic, is greatly decreased.

Although the ICP plasma apparatus equipped with a single turn antenna shown in FIG. 1 is used in the before described embodiment, etching apparatus is not limited to the ICP plasma apparatus equipped with a single turn antenna shown in FIG. 1, and other apparatuses can be used. For example, in the embodiment of the present invention, a helicon plasma apparatus referred to as a so-called high density plasma source, a two-frequency exciting parallel plate plasma apparatus, a microwave plasma apparatus and others can be used instead of the ICP plasma apparatus equipped with a single turn antenna shown in FIG. 1.

In the embodiment of the present invention, in a case where a magnetic material is etched with a non-organic material as a mask material, a structure of a TMR device is not limited to the structure shown in FIGS. 2(a)~2(d) even if the magnetic material is processed into the TMR device.

In the before described embodiments of the present invention, description is given of a case where methanol is used as an etching gas, there can be used any of ketones expressed by a chemical formula RCOR', wherein R or R' is an alkyl group, for example, vaporizable ketones such as methyl ethyl ketone, isopropyl methyl ketone, methyl propyl ketone and the like. Any of hydrocarbons having a methyl group can be used in addition to methane, such as ethane, propane and butane.

Although the preferred embodiments and comparison test examples of the present invention are described above using the attached drawings, the present invention is not limited to the before described embodiments, and it can be altered or modified to various modes without departing from the technical scope construed based on the appended claims.

What is claimed is:

1. A dry etching method comprising generating a plasma of an etching gas and dry-etching a magnetic material using a mask material [made of] *comprising* a non-organic material, wherein *the etching gas is selected from the group consisting of:* an alcohol [having at least one hydroxyl group is used as the etching gas]*; a ketone of formula RCOR', wherein R or R' is an alkyl group; and an alkane.*

2. The dry etching method according to claim 1, wherein the alcohol used as the etching gas has one hydroxyl group.

3. The dry etching method according to claim 1, wherein the etching gas is an alcohol selected from the group consisting of methanol ($CH_3OH$), ethanol ($C_2H_5OH$) and propanol ($C_3H_7OH$).

4. The dry etching method according to claim 1, wherein a mask material made of a non-organic material is a mask material comprising a single layer film or a laminated layer film made of a material selected from the group consisting of Ta, Ti, Al and Si or a mask material comprising a single layer film or a laminated layer film made of an oxide or a nitride of a material selected from the group consisting of Ta, Ti, Al and Si.

5. The dry etching method according to claim 1, wherein the magnetic material to be etched is either an elemental metal belonging to the iron group in the Group VIII or a magnetic material essentially composed of such an elemental metal.

6. The dry etching method according to claim 1, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.

[7. The dry etching method according to claim 2, wherein the etching gas is an alcohol selected from the group consisting of methanol ($CH_3OH$), ethanol ($C_2H_5OH$) and propanol ($C_3H_7OH$).]

8. The dry etching method according to claim 2, wherein a mask material made of a non-organic material is a mask material comprising a single layer film or a laminated layer film made of a material selected from the group consisting of Ta, Ti, Al and Si or a mask material comprising a single layer film or a laminated layer film made of an oxide or a nitride of a material selected from the group consisting of Ta, Ti, Al and Si.

9. The dry etching method according to claim 3, wherein a mask material made of a non-organic material is a mask material comprising a single layer film or a laminated layer film made of a material selected from the group consisting of Ta, Ti, Al and Si or a mask material comprising a single layer film or a laminated layer film made of an oxide or a nitride of a material selected from the group consisting of Ta, Ti, Al and Si.

10. The dry etching method according to claim 2, wherein the magnetic material to be etched is either an elemental metal belonging to the iron group in the Group VIII or a magnetic material essentially composed of such an elemental metal.

11. The dry etching method according to claim 3, wherein the magnetic material to be etched is either an elemental metal belonging to the iron group in the Group VIII or a magnetic material essentially composed of such an elemental metal.

12. The dry etching method according to claim 4, wherein the magnetic material to be etched is either an elemental metal belonging to the iron group in the Group VIII or a magnetic material essentially composed of such an elemental metal.

13. The dry etching method according to claim 2, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.

14. The dry etching method according to claim 3, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.

15. The dry etching method according to claim 4, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.

16. The dry etching method according to claim 5, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.

[17. The dry etching method according to claim 7, wherein a mask material made of a non-organic material is a mask material comprising a single layer film or a laminated layer film made of a material selected from the group consisting of Ta, Ti, Al and Si or a mask material comprising a single layer film or a laminated layer film made of an oxide or a nitride of a material selected from the group consisting of Ta, Ti, Al and Si.]

[18. The dry etching method according to claim 17, wherein the magnetic material to be etched is either an elemental metal belonging to the iron group in the Group VIII or a magnetic material essentially composed of such an elemental metal.]

[19. The dry etching method according to claim 18, wherein an etching gas is added with at least one kind of oxygen gas, water and an inert gas as an added gas, said oxygen gas and water are added at respective content of not more than 25% relative to the etching gas and said inert gas is added at respective content of not more than 90% relative to the etching gas.]

*20. A tunneling magnetoresistance device (TMR) manufacturing method comprising:*

*forming a TMR comprising a pair of ferromagnetic layers comprising a free layer and a pinned layer sandwiching an insulating layer and an antiferromagnetic layer on the pinned layer on a surface thereof opposite to the insulating layer employing the dry etching process of claim 1.*

*21. A magnetic random access memory (MRAM) device manufacturing method comprising the dry etching method as defined in claim 1.*

*22. A magnetic random access memory (MRAM) device manufacturing method comprising forming a magnetic random access memory comprising a pinned layer, a free layer and an insulating layer therebetween, wherein the free layer is provided by the dry etching method of claim 1.*

*23. The dry etching method according to claim 1, wherein the magnetic material is a single or laminated layer film of at least one material selected from the group consisting of Fe—Ni alloy, Co—Fe alloy, Fe—Mn alloy, Co—Pt alloy, Ni—Fe—Cr alloy, Co—Cr alloy, Co—Pt alloy, Co—Cr—Pt alloy, Co—Pd alloy and Co—Fe—B alloy.*

*24. The dry etching method according to claim 1, wherein the dry etching is performed under a vacuum from 0.1 to 10 Pa.*

*25. The dry etching method according to claim 1, wherein the magnetic material is etched at a temperature from 20-100° C.*

* * * * *